United States Patent [19]

Junge

[11] 4,063,324
[45] Dec. 20, 1977

[54] FILM PROCESSING APPARATUS
[75] Inventor: Rodney G. Junge, Lakeland, Minn.
[73] Assignee: Kroy Industries, Inc., Stillwater, Minn.
[21] Appl. No.: 670,980
[22] Filed: Mar. 26, 1976
[51] Int. Cl.² ............................................. G03D 3/13
[52] U.S. Cl. ........................................ 15/100; 15/102
[58] Field of Search ..................... 15/77, 100, 102, 4

[56] References Cited
U.S. PATENT DOCUMENTS

| | | | |
|---|---|---|---|
| 3,098,249 | 7/1963 | Tice et al. | 15/102 X |
| 3,440,675 | 4/1969 | Yeaman | 15/102 X |
| 3,562,834 | 2/1971 | Stievenart et al. | 15/100 |
| 3,630,776 | 12/1971 | Barr | 15/77 |
| 3,694,071 | 9/1972 | Touchette | 15/100 X |
| 3,792,503 | 2/1974 | Brock | 15/77 X |

Primary Examiner—Edward L. Roberts
Attorney, Agent, or Firm—Dorsey, Windhorst, Hannaford, Whitney & Halladay

[57] ABSTRACT

An apparatus for processing film by scrubbing having a rotatable scrubbing roller, an acurately shaped scrubbing plate with its inner surface adjacent to and in scrubbing relationship with the scrubbing roller and means for guiding the film to be processed in linear movement between the roller and the plate. A method for processing film by scrubbing which comprises the steps of guiding the film in an arcuate path in scrubbing relationship with the peripheral surface of a scrubbing roller and rotating the scrubbing roller.

15 Claims, 9 Drawing Figures

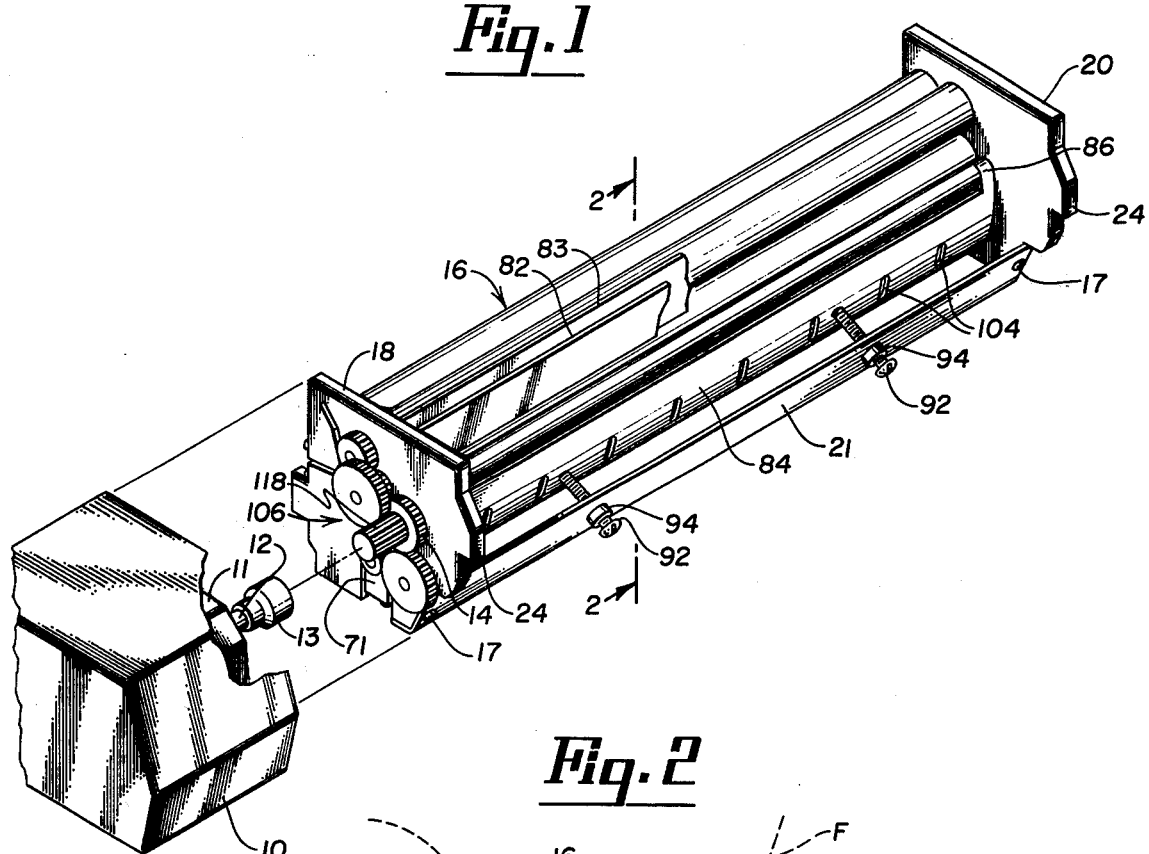

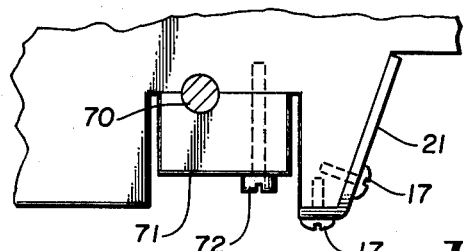
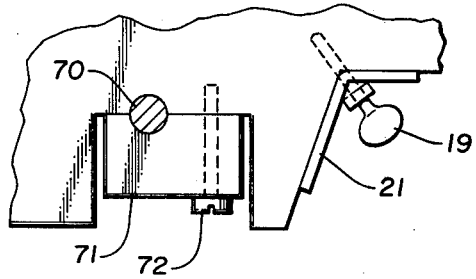
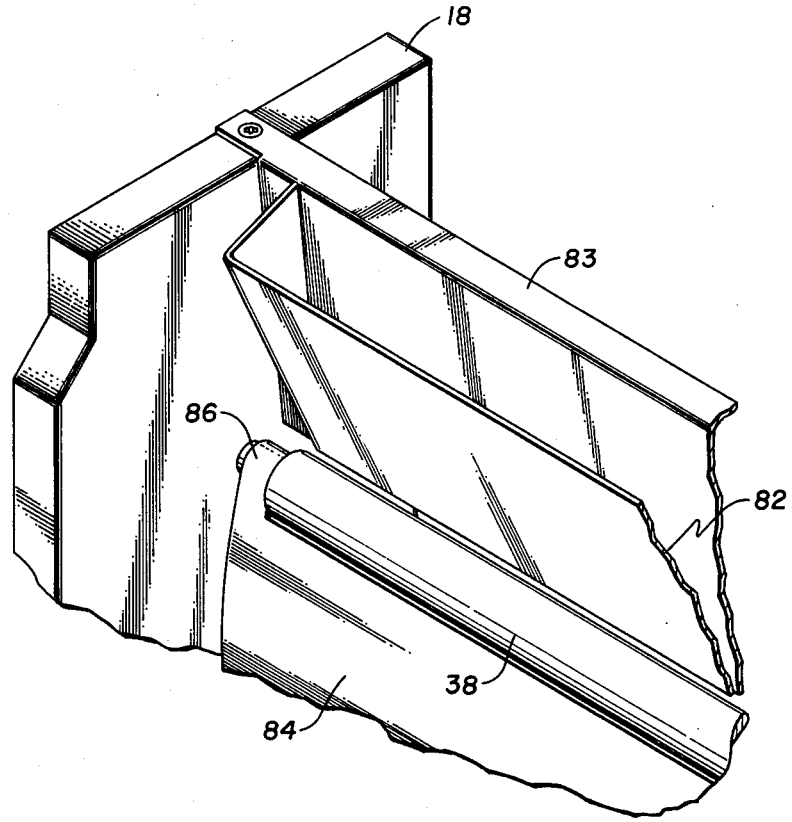
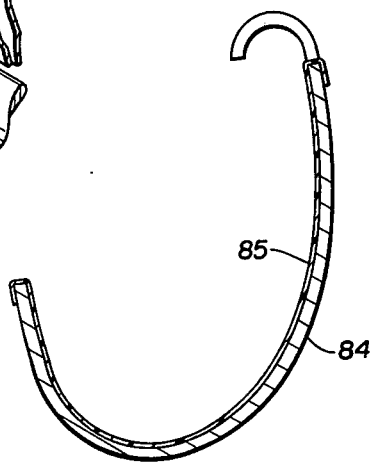

FILM PROCESSING APPARATUS

BACKGROUND OF THE INVENTION

1. Field of the Invention

This invention relates to a film processing apparatus and method, and, more specifically, to an improved film processing apparatus and method of the type wherein a surface of the film is scrubbed.

2. Description of the Prior Art

In processing image-carrying films in which an image has been formed on one surface of the film by causing certain portions of an emulsion layer to be fixed to that surface, while other portions remain unfixed, it is desirable to scrub the image surface to remove the unfixed emulsion therefrom. For this purpose, rollers having a roughened or non-smooth scrubbing surface have been used to scrub such image surface. In prior apparatus and methods, the film to be processed is moved past the scrubbing roller or rollers in a relatively straight line, thus permitting relatively limited scrubbing contact between the peripheral scrubbing surface of the scrubbing rollers and the film. Such structure in prior art machines has given rise to several disadvantages. First, because of the speed differential between the scrubbing surface of the roller and the film, there is a tendency for the scrubbing roller to catch or snag, and thereby damage, the trailing or leading edges of the film as it moves past the scrubbing surface. Also because of the speed differential, the leading or trailing edge would sometimes buckle or be pushed ahead thus preventing sufficient and uniform scrubbing action on such edges. Additionally, the scrubbing process is quite inefficient due to the fact that the scrubbing surface of the roller and the film surface are in contact with each other only for a very short period of time as the film moves past the scrubbing roller.

SUMMARY OF THE INVENTION

According to the present invention, an apparatus for processing film by scrubbing comprises a rotatable scrubbing roller; an arcuately-shaped scrubbing plate, the inner surface of the plate being adjacent to and in scrubbing relationship with the scrubbing roller; and means for guiding the film to be processed in linear movement between the roller and the plate. The method of the present invention comprises the steps of guiding the film in an arcuate path in scrubbing relationship with the peripheral surface of a scrubbing roller and rotating the scrubbing roller.

More specifically, the scrubbing plate of the present invention is a generally arcuate member having an inner surface which, in the preferred embodiment, is comprised of, or coated with, a material which is effective to reduce or limit the surface tension between the film and such inner surface. The arcuate scrubbing plate is disposed in scrubbing relationship with a substantial arc or portion of the circumference of the scrubbing roller. The scrubbing roller is comprised of a foam-like material and, in the preferred embodiment, rotates in the same direction as, and substantially faster than, the linear movement of the film through the apparatus. The film is moved and guided through the apparatus in part by the arcuate contour of the scrubbing plate and in part by a plurality of rollers. A plurality of openings provided in the scrubbing plate allow circulation around the scrubbing roller of a scrubbing solvent contained in a tank in which a portion of the scrubbing plate and roller are immersed. This circulation removes scrubbing residues from the roller.

Due primarily to the acrcuate contour of the scrubbing plate and its relationship to the scrubbing roller, the scrubbing contact between the scrubbing roller and the film which is guided between the roller and plate is substantially increased over that of prior machines in which the film contacts the roller in a relatively straight line position. This results in greater scrubbing efficiency. Further, because of the arcuate shape of the scrubbing plate, the film tends to adhere to or be biased against the inner surface of the plate, thus reducing or substantially eliminating the possibility of the film edges being snagged or damaged by the rotating scrubbing roller.

Accordingly, it is an object of the present invention to provide a film processing apparatus and method with increasing scrubbing efficiency.

Another object of the present invention is to provide a film processing apparatus having an arcuate scrubbing plate for increasing the scrubbing contact between the scrubbing roller and the film.

A further object of the present invention is to provide a processing apparatus in which a film can be processed without damage to its leading or trailing edges and in which both the leading and trailing edges of the film can be sufficiently and uniformly scrubbed.

Another object of the present invention is to provide an improved film processing method providing increased scrubbing efficiency as the result of greater scrubbing contact between the scrubbing roller and the film.

These and other objects will become apparent with reference to the drawings, the description of the preferred embodiment and the appended claims.

BRIEF DESCRIPTIONS OF THE DRAWINGS

FIG. 1 is a pictorial view of a portion of the film processing apparatus of the present invention.

FIG. 2 is an end view, partially in section, of the film processing apparatus of the present invention taken along the line 2—2 of FIG. 1, showing the scrubbing solvent tank and the relationship between the rollers of the roller assembly.

FIGS. 6 and 7 are detail views of the bearing blocks for supporting the foam scrubbing roller and alternate embodiments of the pressure adjustment plate which also provides stability to the structure.

FIG. 8 is an end view of an alternate embodiment of the film insertion chute or guide plates.

FIG. 9 is a cross section of the scrubbing plate showing the inner surface coating.

DESCRIPTION OF THE PREFERRED EMBODIMENT

Figure 3:
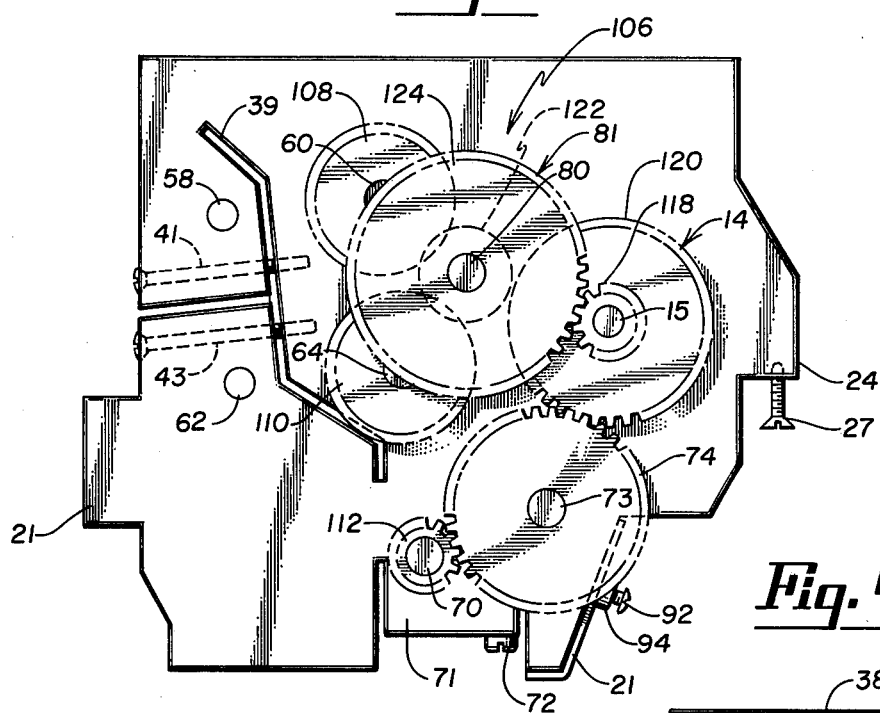
FIG. 3 is an end view of the gear assembly.

In general, as shown best in FIGS. 1 and 2, the apparatus of the present invention includes a roller assembly 16 supported between a pair of end plates 18 and 20; a means in the form of a pair of guide plates 82 and 83 for guiding the film F to be processed into the roller assembly 16; a scrubbing roller 40, comprising a part of the roller assembly 16; an arcuate scrubbing plate 84 disposed around a substantial portion of the roller 40, thereby defining a scrubbing station between the roller 40 and the scrubbing plate 84; and a means for bathing the scrubbing roller 40 with a solvent to remove scrubbing residues. During operation, the film F to be processed is guided into, through and out of the apparatus by the guide plates 82, 83, the roller assembly 16 and the scrubbing plate 84. During its movement between the roller 40 and the plate 84, the film F is scrubbed by the scrubbing roller 40 which is rotating at a speed faster than the linear speed of the film F through the machine. The commercial embodiment of the apparatus is enclosed within an elongated outer housing (not shown) which has appropriately positioned longitudinal slots through which the film to be processed enters and through which it exits after processing. Contained within one end of the elongated outer housing is an electric drive motor 11 of the shaded pole type, rated at 160 rpm and covered by a suitable motor housing 10. The drive shaft 12 of the motor 11 extends from one end of the motor 11 and includes a coupling 13 with gear teeth for engagement with the gear assembly of the machine as discussed below.

The roller assembly 16 is mounted between two irregularly shaped end plates 18 and 20. Together with the scrubbing plate 84 and the pair of guide plates 82, 83, it guides and moves the film F into, through and from the scrubbing station. The end plates 18, 20 are connected by a pressure adjustment plate 21 fastened to the end plates 18, 20 by a pair of screws 17 at each of its ends. The pressure adjustment plate 21, which may take either the form shown in FIGS. 1, 2 and 6 or the simpler, thumbscrew-fastened alternate embodiment of FIG. 7, is constructed of a sufficiently rigid material such that the end plates 18, 20 are stably held and cannot be rotated relative to one another. As shown in the embodiments of both FIGS. 6 and 7, the pressure adjustment plate 21 comprises an angle member having portions fastened to or contacting at least two edge surfaces of the end plates 18 and 20. It has been found that such structure provides sufficient stability. Also, as will be discussed below, the plate 21 provides a means for adjusting the scrubbing pressure to be applied between the scrubbing plate 84 and the roller 40.

As shown in FIG. 2 the entire roller assembly 16 is supported by a tank 22 containing a liquid scrubbing solvent 23, which is water in the preferred embodiment. The roller assembly 16 is supported on top of the tank 22 by a pair of flanges 21, 24 which are disposed on each side of the end plates 18, 20. The flange 21 rests on the outwardly turned lip 25 of the solvent tank 22, whereas the flange 24, together with an associated adjustment screw 27, rests on the lip 26. The flanges 21, 24 on each end plate and the lips 25, 26 on the tank 22 are positioned so that the roller assembly 16 is generally horizontally supported with the lower portion thereof being immersed in the liquid scrubbing solvent 23. When the solvent tank 22 is filled almost to the height of the lip 25, approximately one-half of the roller 40 is immersed. Adjustment of the position of the roller assembly 16, which may be necessary to align the motor shaft 12 and coupling 13 with the input drive gear 14, is made by loosening or tightening the screws 27 which extend from the flange 24 and contact the lip 26.

The roller assembly 16 is comprised of the rollers 28, 30, 32, 34, 36, 38 and 40 which are mounted on shafts 58, 60, 62, 64, 66 68 and 70, respectively. The shafts 58, 60, 62, 64, 66, 68 and 70 extend through and are journaled in the irregularly shaped end plates 18, 20 so that their axes are horizontal and parallel. As shown in FIGS. 3, 6 and 7, the shaft 70 which supports the scrubbing roller 40 is rotably supported at each end by a bearing surface formed in part by a portion of the lower edge of the end plates 18, 20 and in part by the upper surface of a bearing block 71 secured to the end plates 18, 20 by a screw 72. This construction facilitates easy removal of the shaft 70 and roller 40 for purposes of replacement or cleaning.

As shown best in FIG. 2, the rollers 28, 30, 32 and 34, whose primary function is to help move the film out of the apparatus, are located so that a line drawn through the axes of rollers 32 and 28 or through rollers 34 and 30 in the plane of either end plate 18, 20 would form an angle offset from the vertical. In the preferred embodiment, this is approximately a 7° angle. The purpose of the rollers 28 and 30 being offset from the rollers 32 and 34 is to insure that the film will be directed away from the feed guides 82 and 83 as it leaves the apparatus.

The rollers 28, 30, 32 and 34 are composed of a hard rubber material which is preferably a heat, chemical and ozone resistant material, having non-absorbent properties. An EPDM material having a durometer of approximately 50 has been found to be acceptable. The rollers 36 and 38, on the other hand, are composed of steel or other suitable metal. Although other materials are acceptable, the scrubbing roller 40 is preferably comprised of a urethane foam material characterized as having approximately 90-100 pores per square inch. The material is further characterized as having a 0.6 pounds-per-square-inch compression loading at 25% deflection.

The various rollers in the roller assembly 16 are so located in relation to one another that there is a physical interference of approximately 0.005 to 0.010 inch between rollers 28 and 30 and between rollers 32 and 34, approximately 0.010 inch between rollers 32 and 36, and approximately 0.015 inch between rollers 34 and 38. While these interference dimensions are those of the preferred embodiment, the physical interference of the rollers may be varied to some extent without substantially changing their function. The intention, however, is to maintain an approximately equal compressive force between the respective roller pairs of a magnitude sufficient to perform the function of moving the film through the apparatus and squeegeeing the solvent from the film.

Adjustment of the interference between the various squeegee rollers is facilitated by the approximately T-shaped channel or slot 39 extending from the outer edge of each end of the plates 18, 20 into the area between shafts 58, 60, 62 and 64, as best shown in FIG. 3. The presence of this slot 39 gives some resilience to those lobes of the end plates 18, 20 where the shafts 58 and 62 are journaled. A pair of adjustment screws 41, 43 running from the outer edge of each of the end plates 18, 20 across the slot 39 may be tightened or loosened to increase or decrease, respectively, the physical interference between the rollers 28 and 30 and between the rollers 32 and 34.

As shown in FIG. 3, the plate 18 nearest the motor not only journals the shafts 58, 60, 62, 64, 66, 68 and 70 of rollers 28, 30, 32, 34, 36, 38 and 40, respectively but also supports the pin 15 on which input cluster drive gear 14 is rotatably mounted. The end plate 18 further supports the pin 73 on which the idler gear 74 is rotatably mounted for transmission of motion from the larger gear 120 of the cluster drive gear 14 to the gear 112 which drives the scrubbing roller 40. The end plate 18 additionally supports the shaft 80 on which the idler cluster gear 81 is rotatably mounted. The cluster gear 81 comprises the gears 122 and 124 and functions to transmit rotational motion from the cluster drive gear 14 to the rollers 30 and 34 (FIG. 2). Specifically, the smaller spline gear 118 of the cluster drive gear 14 drives the gear 81 through engagement with the gear 124, and the associated gear 122 drives both of the gears 108 and 110 connected with the rollers 30 and 34.

Extending between the end plates 18, 20 and connected thereto by appropriate fastening means, as shown best in FIGS. 1 and 2, are two flat feed guide plates 82, 83, the latter being substantially vertical and the former being disposed at an angle of about 30° from the vertical. The upper edges of guide plates 82, 83 which are adjacent to a feed-in slot in the outer housing (not shown) coincide substantially with the upper edges of end plates 18 and 20 and are sufficiently wide to facilitate insertion of the film F to be processed. The guides 82, 83 converge as they extend downwardly toward the roller assembly 16, with each guide plate 82, 83 terminating in a horizontal edge in close proximity to the point of tangency between the rollers 34 and 38. At these lower edges, the guide plates 82, 83 are only a fraction of an inch apart. Accordingly, as best shown in FIG. 2, the guide plates 82, 83 together form a necked-down chute or means for guiding the film F to be processed into the roller assembly 16.

In an alternate embodiment, illustrated in FIG. 8, the guide plate 82 does not extend the full length between the end plates 18 and 20; rather, the plate 82 is appropriately attached to the plate 83, which in turn is connected to and extends between the ends 18 and 20, to form a one-piece guide assembly. Specifically, in the embodiment of FIG. 8, the ends of the plate 82 are bent at right angles and connected with a portion of the plate 83 to form the appropriate structure.

Also extending between the two end plates 18, 20 is an arcuate scrubbing plate 84. As shown best in FIG. 2, the scrubbing plate 84 comprises a curved metal plate whose arcuate shape generally follows the circular contour of the scrubbing roller 40 for nearly one-half of the scrubbing roller's circumference. Although the extent to which the plate 84 conforms to the circumference of the scrubbing roller 40 may vary, it is important to the present invention that the plate be generally arcuate (as opposed to being straight). Although as illustrated, the preferred embodiment shows the plate 84 conforming to approximately one-half of the circumference of the roller 40, it is recognized that the advantages of the present invention are realized even though the curvature of the plate 84 is much less than that shown. For example, any curved scrubbing plate will provide greater scrubbing contact between the roller 40 and plate 84 than a substantially straight or flat plate, although preferably the plate 84 should be curved so that the roller 40 is engaged in scrubbing contact with the film throughout at least 25% of the circumference of the roller 40.

Figure 4:
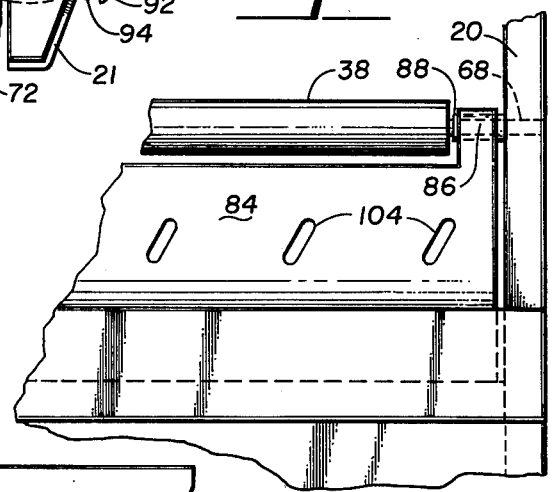
FIG. 4 is a detailed view of the manner of supporting the scrubbing plate.

As best shown in FIG. 9, the inner surface of the scrubbing plate 84 adjacent to the roller 40 is covered with a thin layer of material 85 which is effective to reduce or limit the surface tension between the film F and the scrubbing plate 84. In the preferred embodiment the material 85 is a textured vinyl material. As shown in FIG. 4, the scrubbing plate 84 is supported by a tab 86 extending from each end of the scrubbing plate 84. As further shown in FIGS. 1 and 2, the tabs 86 are bent to partially encircle the ends of the shaft 68. A suitable bearing 88 disposed between the shaft 68 and the tabs 86 at each end prevents the shaft 68 from wearing against the tabs 86. As shown best in FIGS. 1 and 2, a pair of adjustment screws 92 are butted against the plate 84 for adjustment purposes. The screws 92 extend through a pair of threaded bushings 94 located in the pressure adjustment plate 21. By appropriate rotation of the screws 92, the pressure exerted by the scrubbing plate 84 against the roller 40, and thus the scrubbing pressure between the roller 40 and film F, can be varied.

Figure 5:
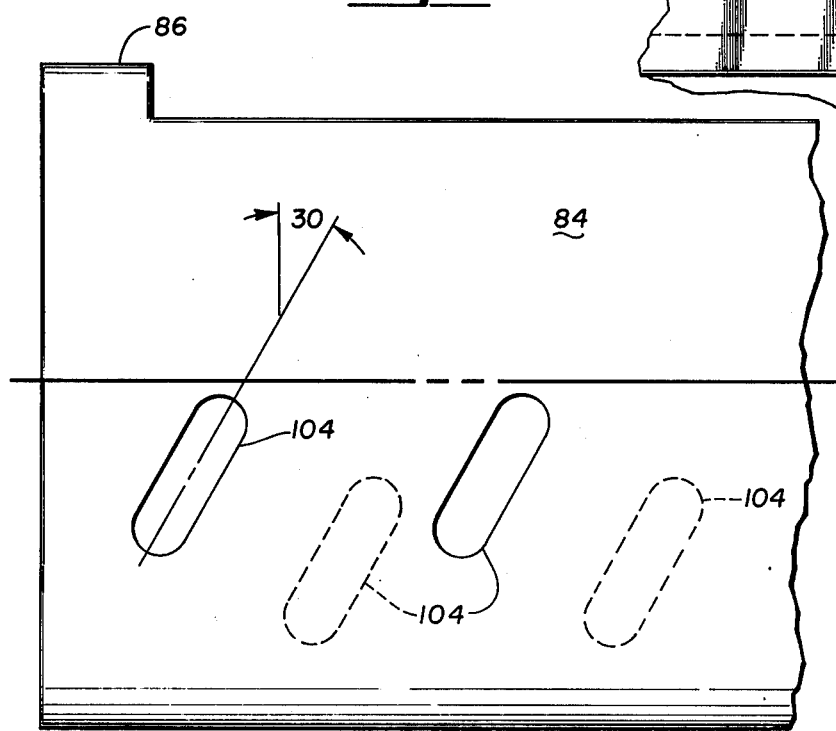
FIG. 5 is a detailed view of the solvent fluid flow-through openings in the scrubbing plate.

Referring now to FIGS. 4 and 5, in order to allow the scrubbing solvent 23 to enter the trough-like area formed by the scrubbing plate 84 and to come into contact with the foam roller 40, the plate 84 is provided with a plurality of angled slots or holes 104 on either side thereof just above the contact point between the scrubbing plate 84 and the roller 40. These slots 104 allow the scrubbing solvent 23 to flow freely over and around the foam roller 40 during rotation thereof and when not blocked by the presence of a film. While the slots 104 allow the scrubbing solvent to easily contact the roller 40, the generally enclosed structure formed by the arcuate scrubbing plate 84 reduces the amount of air entering the area where scrubbing occurs. This reduces frothing of the scrubbing solvent 23 which might otherwise retard scrubbing action. The slots 104 are slanted approximately 30° from the vertical, so as to avoid any tendency to catch or snag the leading edge of the film F as it moves through the scrubbing station.

Referring now to FIG. 3 the roller assembly 16 is driven by the gear assembly 106 which includes: the gear 108 attached to the shaft 60 and the drive roller 30; the gear 110 attached to the shaft 64 and the drive roller 34; the gear 112 attached to the shaft 70 and the scrubbing roller 40; the input drive cluster gear 14 which includes a small spline gear 118 for attachment to the drive shaft 12 via the coupling 13 and a large gear sprocket 120; the idler cluster gear 81 attached to the shaft 80 which includes a small gear sprocket 122 for engagement with the gears 108 and 110 and a large gear sprocket 124 for engagement with the spline gear 118; and the idler gear 74 mounted on the shaft 73 for engagement with the gear sprocket 120 and the small gear 112.

While a variety of gear ratios would be suitable for the present apparatus, the preferred embodiment has the following gear ratios which have been found to produce relative speeds among the various rollers which are satisfactory for the type of film processing contemplated in the present invention. Using gears 108 and 110 mounted on shafts 60 and 64, respectively, as index gears having a ratio value of 1, the ratios of the other gears can be specified as follows: The small spline gear 118 of the input drive cluster gear 114 has a gear ratio of 0.50, the gear 120 has a ratio of 1.25, the small gear 122 of the cluster gear 81 has a ratio of 0.50, the large gear 124 has a ratio of 1.50, and the gear 112 attached to the foam roller shaft 70 also has a ratio of 0.50. When the input drive speed to the spline gear 118 is 155 rpm in a clockwise direction, the above gear ratios result in a rotational speed of approximately 388 rpm clockwise for the foam roller 40 and a speed of approximately 26 rpm for the rubber drive rollers 30, 34 and the rubber idler rollers 28, 32. Considering the relative diameters of the rollers 28, 30, 32 and 34 and the roller 40, this results in a ratio of foam roller surface speed to rubber roller surface speed, and therefore foam roller surface speed to linear speed of the film F, of approximately 19 to 1. Accordingly, the scrubbing action in the present apparatus is accomplished as a result of the surface of the scrubbing roller 40 being in scrubbing relationship with and moving approximately 19 or 20 times faster than the linear speed of the film F.

The apparatus and method of the present invention are designed to process films of the type having an image surface with an emulsion layer, some areas of which are fixed to the film (and cannot be removed by scrubbing), and other areas of which are unfixed (and can be removed by appropriate scrubbing). Processing and scrubbing by the apparatus and method of the present invention effectively removes the loose or unfixed emulsion portions of the image surface, leaving the fixed image portions intact.

The method of the present invention and the operation of the apparatus of the invention can be explained together. In operation, the apparatus receive a sheet of film F (FIG. 2) through a feed-in-slot in the outer housing. The film F is inserted so that the image surface to be processed is adjacent the substantially vertical feed guide plate 83. The film is guided into the necked-down entry formed by the plates 82, 83 to the point of tangency between the feed-in rollers 34 and 38, rotating clockwise and counterclockwise, respectively as viewed in FIG. 2. The physical interference or compressive force between the rollers 34 and 38 causes the film F to be grasped and moved downwardly toward the foam roller 40 and scrubbing plate 84. The clockwise rotation of the foam roller 40 helps guide the film F towards the scrubbing plate 84 so that the leading edge of the film is guided in part by the roller 40 into the area of tangency between the foam roller 40 and the vinyl surface 85 of the scrubbing plate 84. It should be pointed out that the film F should preferably be contacted first by the roller 40 to avoid the possibility of the film F buckling as a result of surface tension between the film F and scrubbing plate 84 or surface 85. The film F continues such movement until it contacts and is guided into its arcuate path by the vinyl surface 85, at which time the scrubbing process begins. The vinyl surface 85, bathed by the scrubbing solvent 23, provides a relatively low-friction, low-surface-tension surface against which the non-image surface of the film F can slide during the scrubbing process.

The film moves and is guided along the arcuate path between the foam roller 40 and the scrubbing plate 84 at a speed controlled by the speed of the feed-in rollers 34 and 38. Due to the gear ratios and relative diameters of the rollers, this speed is about twenty times less than the peripheral or surface speed of the foam roller 40. Thus, a scrubbing action occurs between the roller 40 and the film F which removes the loose or unfixed emulsion on the image surface of the film F. Since, in the preferred embodiment, the arcuate shape of the scrubbing plate 84 follows the surface of foam roller 40 for approximately half its circumference, the scrubbing action against a particular spot on the film F continues throughout its movement between the roller 40 and plate 84.

Also, due to the specific construction of the device, the scrubbing solvent is caused to circulate and flow through the slots 104 in the plate 84 and around the roller 40 to wash away the emulsion particle residue released by the scrubbing action. Such circulation and flow is caused in part by the rotation of the roller 40 and in part by the sponging action of the roller 40. This sponging action is a result of the fact that in the preferred construction or operation of the present device, the shaft 70 of the foam roller 40 is positioned nearer to the right-hand portion of the plate 84 (as viewed in FIG. 2) than it is to the left-hand portion of the plate 84. Thus, in the preferred operation, the right-hand half of the roller 40 (as viewed in FIG. 2) is squeezed against the right-hand portion of the plate 84, while the left-hand half of the roller 40 remains relatively undeformed. Such condition is created most easily by appropriate adjustment of the screws 92, the adjustment being such as to move the entire plate 84 toward the left as viewed in FIG. 2. As a result of this position of the roller 40 relative to the plate 84, solvent flows through the holes 104 in the left side of the plate 84 and is absorbed by the left-hand half of the foam roller 40. As the roller 40 rotates in a clockwise direction toward the right-hand side of the plate 84, it is squeezed against the plate 84, causing the solvent to be squeezed from the roller 40 and flow out through the holes 104 in the right-hand side of the plate 84. While the film F is in the machine, the holes 104 are covered by the film, thereby inhibiting the flow and circulation of solvent. Thus, the most significant circulation and flow of solvent 23 by the above-described sponging action occurs before the film enters and after the film leaves the scrubbing area.

As the leading edge of the film F completes its clockwise advance around the foam roller 40, it follows the contour of the scrubbing plate 84 by which it is guided toward the roller 32. The film F then butts into or contacts the roller 32 and is guided into the point of tangency between the rollers 32 and 36. The leading edge of the film is grasped between the rollers 32 and 36 and fed toward the point of tangency between the rubber 32 and 34 which comprise a first pair of squeegee rollers. These rollers 32 and 34 then feed the film into the tangent point between the rubber rollers 28 and 30 which comprise a second pair of squeegee rollers. The rollers 28, 30, 32 and 34 are angularly positioned so that the film is directed toward an exit slot in the outer housing (not shown). This angular position of the rollers 28, 30, 32 and 34 also causes the film to bend away from the feed-in guides 82 and 83.

Control of the leading edge and middle part of the film F during movement through the machine presents no problems since the roller 40 is rotating in the same direction as the linear movement of the film. The trailing edge of the film does, however, present a potential source of difficulty in most machines of this type since there is a tendency to catch or snag the trailing edge. This is avoided in the present machine because of the arcuate shape of the scrubbing plate 84. As the trailing edge of the film moves past the rollers 34 and 38, it springs outwardly toward the plate 84 because of the shape of the plate 84 and the characteristic of the film to flatten out unless otherwise restrained. Surface tension then retains the trailing edge in contact with the surface 85, preventing the roller 40 from snagging or catching such edge. As the trailing edge of the film leaves the scrubbing station, there is again a danger that the foam roller 40 will catch or snag such edge. The present machine also avoids this latter tendency to snag or catch by forcing the film into the contour of the scrubbing plate 84. This is accomplished as a result of a sharp turn in the film's path as it travels between the rollers 32 and 36 and the general arcuate shape of the plate 84. The film F is also held against the surface 85 by surface tension between such surface and the film. Thus, the trailing edge of the film is forced to adhere to the contour of the scrubbing plate 84 and cannot be caught or snagged by the foam roller 40.

The unfixed emulsion is washed off the image surface of the film and passes into the solvent tank 22. Thus, emulsion particles will accumulate in the bottom of the tank 22. Accordingly, the tank 22 can occasionally be drained, rinsed out and refilled. If the machine is used heavily such that the tank 22 would have to be drained frequently, a continuous flow of solvent liquid through the tank can be arranged, so that no accumulation occurs.

Although the description of the preferred embodiment has been quite specific, it is contemplated that various modifications of both the apparatus and method disclosed herein could be made without deviating from the spirit of the invention. Thus, it is intended that the scope of the present invention be dictated by the appended claims rather than by the preferred embodiment described above.

What is claimed as new and desired to be secured by Letters Patent of the United States is:

1. An apparatus for scrubbing the surface of a film comprising:
   a reservoir for containing a scrubbing solution;
   an elongated rotatable scrubbing roller;
   an elongated arcuately shaped scrubbing plate adapted for at least partial submersion in said scrubbing solution, the inner surface of said plate being adjacent to and in scrubbing relationship with said scrubbing roller to thereby define a scrubbing station;
   means for guiding the film in linear movement between said scrubbing roller and said plate; and
   means for circulating said scrubbing solution between said reservoir and said scrubbing station comprising a plurality of holes disposed in said scrubbing plate such that said holes are adapted for at least partial submersion in said scrubbing solution.

2. The apparatus of claim 1 wherein said scrubbing roller is rotatable in the same direction as the linear movement of the film between said scrubbing roller and plate.

3. The apparatus of claim 1 wherein the inner surface of said scrubbing plate is comprised of a material effective to reduce the surface tension between the film and said scrubbing plate.

4. The apparatus of claim 3 wherein the inner surface of said scrubbing plate is comprised of a textured vinyl material.

5. The apparatus of claim 1 having adjustment means for adjusting the scrubbing pressure exerted by said scrubbing roller on the film.

6. The apparatus of claim 5 wherein said adjustment means comprises a threaded member for adjusting the relative positions of said scrubbing roller and said scrubbing plate.

7. The apparatus of claim 1 wherein said scrubbing plate includes an arcuate scrubbing portion adapted for substantial submersion in said scrubbing solution and a film guide portion on each side of said scrubbing portion extending generally above the level of said scrubbing solution.

8. The apparatus of claim 7 wherein said scrubbing plate includes a plurality of holes on each side thereof such that said holes are adapted for at least partial submersion in said scrubbing solution.

9. The apparatus of claim 8 wherein said plurality of openings comprise generally elongated openings having rounded ends, so oriented that an axis drawn in the direction of elongation would form an acute angle with the direction of linear movement of the film between said scrubbing roller and plate.

10. The apparatus of claim 1 having means for guiding said film toward said scrubbing roller and plate and away from said scrubbing roller and plate, said means including a rotatable guide roller mounted above said scrubbing roller and first and second idler rollers associated with opposing surfaces of said guide roller for guiding said film to and from said scrubbing roller and plate.

11. The apparatus of claim 10 wherein said scrubbing roller and said scrubbing plate are in scrubbing relationship for approximately one-half of the periphery of said scrubbing roller.

12. The apparatus of claim 10 having a third idler roller adapted for engagement with said second idler roller at a point along the travel path of said film between said scrubbing roller and plate and the engagement between said guide roller and second idler roller, said third idler roller being oriented to cause said film to be forced against the inside surface of said scrubbing plate as it is guided away from the scrubbing station.

13. An apparatus for scrubbing the surface of a film comprising:
   a reservoir for containing a scrubbing solution;
   an elongated rotatable scrubbing roller;
   an elongated arcuately shaped scrubbing plate adapted for at least partial submersion in said scrubbing solution, the inner surface of said plate being adjacent to and in scrubbing relationship with said scrubbing roller to thereby define a scrubbing station;
   means for causing circulation of said scrubbing solution between said reservoir and said scrubbing station; and
   means for guiding said film toward said scrubbing roller and plate and away from said scrubbing roller and plate, said means including a rotatable guide roller mounted above said scrubbing roller and first and second idler rollers associated with opposing surfaces of said guide roller for guiding said film to and from said scrubbing roller and plate.

14. The apparatus of claim 13 wherein said rotatable guide roller is mounted substantially directly above said scrubbing roller.

15. The apparatus of claim 13 having a third idler roller adapted for engagement with said second idler roller at a point along the travel path of said film between said scrubbing roller and plate and the engagement between said guide roller and second idler roller, said third idler roller being oriented to cause said film to be forced against the inside surface of said scrubbing plate as it is guided away from the scrubbing station.

* * * * *